(12) United States Patent
Winkler et al.

(10) Patent No.: US 6,576,908 B1
(45) Date of Patent: Jun. 10, 2003

(54) BEAM COLUMN FOR CHARGED PARTICLE BEAM DEVICE

(75) Inventors: Dieter Winkler, Munich (DE); Hans-Peter Feuerbaum, Munich (DE); Ralf Degenhardt, Aschheim (DE)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/432,543

(22) Filed: Nov. 3, 1999

(30) Foreign Application Priority Data

Nov. 6, 1998 (EP) .............................. 98121201

(51) Int. Cl.⁷ ................................................ H01J 37/30
(52) U.S. Cl. ............................... 250/396 R; 250/492.2; 250/492.1
(58) Field of Search ............................ 250/396 R, 492, 250/492.1, 492.2

(56) References Cited

U.S. PATENT DOCUMENTS

| 3,519,927 | A | * | 7/1970 | Holt | 324/24 |
| 4,066,905 | A | * | 1/1978 | Dassler | 250/396 R |
| 4,087,720 | A | * | 5/1978 | Takagi | 315/111.9 |
| 4,651,003 | A | | 3/1987 | Feuerbaum | |
| 4,820,927 | A | * | 4/1989 | Langner | 250/492.2 |
| 5,133,825 | A | * | 7/1992 | Hakamata et al. | 156/345 |
| 5,284,544 | A | * | 2/1994 | Mizutani et al. | 156/345 |
| 5,466,942 | A | | 11/1995 | Sakai et al. | |
| 5,981,960 | A | * | 11/1999 | Ooaeh et al. | 250/492.2 |

FOREIGN PATENT DOCUMENTS

| EP | 0 179 294 A1 | 4/1986 |
| EP | 0 797 236 A2 | 9/1997 |
| FR | 2 488 043 | 2/1982 |

* cited by examiner

Primary Examiner—John R. Lee
Assistant Examiner—Anthony Quash
(74) Attorney, Agent, or Firm—Sughrue Mion, LLP

(57) ABSTRACT

A charged particle beam column with a first vacuum chamber further comprises a particle source for providing a beam of charged particles and a multi aperture unit with at least two beam defining apertures for shaping the beam of charged particles. The particle source and the beam defining apertures are located within the first vacuum chamber. A separation unit for isolating a second vacuum chamber from the first vacuum chamber whereby the separation unit comprises a path aperture for the charged particle beam is arranged between the first and second vacuum chamber. A first deflecting unit directs the beam of charged particles through one of the beam defining apertures and a second deflecting unit directs the beam of charged particles through the path aperture.

20 Claims, 4 Drawing Sheets

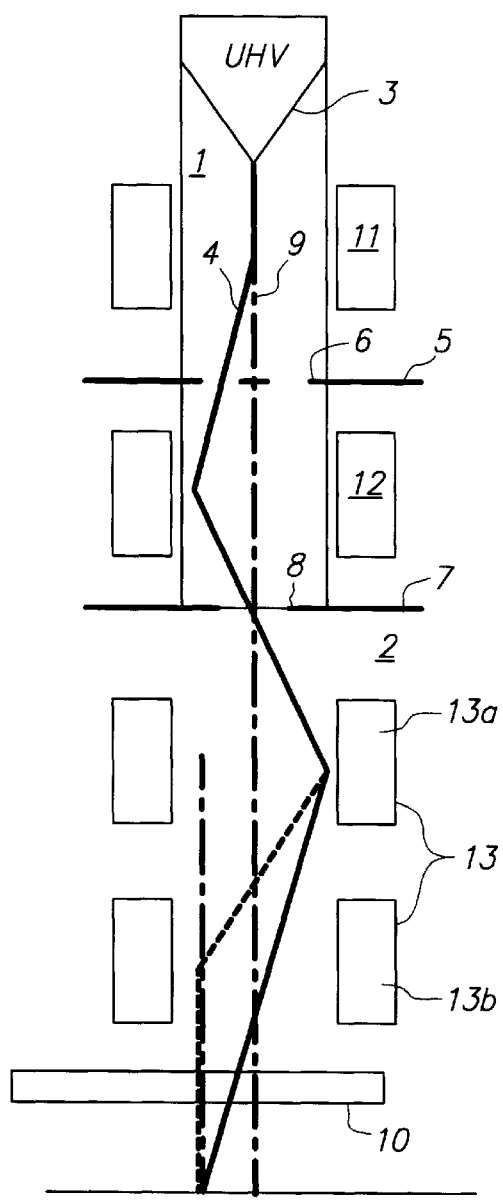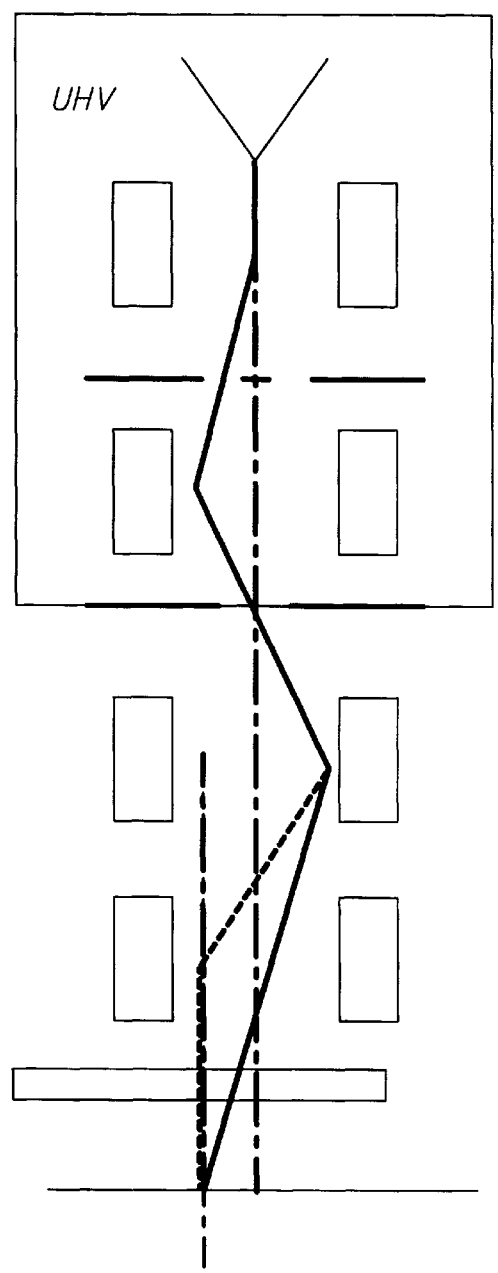

BEAM COLUMN FOR CHARGED PARTICLE BEAM DEVICE

FIELD OF THE INVENTION

This invention relates to a charged particle beam device for the examination of specimens. In particular, this invention relates to the beam column used for guiding the charged particle beam.

BACKGROUND OF THE INVENTION

Beams of negatively or positively charged particles can be used for the examination of specimens. Compared to optical light, the resolving power of a beam of charged particles is several magnitudes higher and allows for the examination of much finer details. In charged particle beam devices, electric or magnetic fields, or a combination thereof, act upon the beam in a manner analogous to that in which an optical lens acts upon a light beam. In particular, any electric or magnetic field which is symmetrical about an axis is capable of forming either a real or a virtual charged particle image. Hence, an axially symmetric electric or magnetic field is analogous to a spherical lens. Furthermore, similar to light-optics, apertures are also used in charged particle devices. The primary use of these apertures is to limit the diameter of the beam of charged particles or to eliminate stray or widely scattered particles. However, in charged particle devices, apertures are an easy target for contamination caused by hydrocarbons.

Charged particles on their path from particle source to the specimen to be examined are strongly scattered by all forms of matter including air. Hence, the entire instrument must, in general, be evacuated. Nevertheless, the presence of hydrocarbon molecules in vacuum chambers is virtually unavoidable. These are commonly formed in vacuum chambers of the charged particle devices as a result of hydrocarbons and silicon oils migrating from vacuum pumps or evaporated from vacuum seals. Radiation of hydrocarbon molecules with charged particles leads to cracking of bonds and to the creation of carbon double bonds. The formation of carbon double bonds, in turn, results in cross linking and the final product will be a carbonaceous polymerized substance. In particular, the edges of apertures which serve to limit the diameter of a particle beam are exposed to particle radiation. At these edges, carbon-rich films or contamination needles easily form and grow into the openings which: change the shape of the passing beam.

Furthermore, these contaminations protruding into the openings are getting charged by the particle beam. The impinging particles are absorbed by the protrusions which could primarily be classified as insulators. The charge build up causes the passing particle beam to deflect and results in imaging artifacts. Due to the constant accumulation of charge, the voltage of a contamination increases until it reaches the break down point. At that point, a sudden discharge will take place and the imaging artifact, caused by charging, disappears. The subsequent absorption of charged particles will again build up the voltage of the contamination until it reaches the break down point. This cyclical process results in a periodic artifact of image flickering. Additionally, there is the artifact caused by the slowly growing contamination layer at the edge of an aperture which steadily narrows the diameter of the passing beam.

In some devices multi apertures have been used for obtaining a variety of preselected beam diameters. A plate comprising several apertures with distinct diameters is placed between particle source and specimen. The beam of charged particles is then guided through one of these apertures in order to reduce it to a desired diameter before it impinges onto the specimen to be examined. Without limiting the scope of the invention, the following explanations will primarily concentrate on the use of electrons as charged particles. An impinging beam of electrons with a given electron density and a bigger beam diameter causes more primary electrons to hit the target. The higher number of interactions between primary electrons and target result, in general, in an increase of secondary products being detected and, consequently, in a higher imaging contrast. On the other hand, a smaller beam diameter,with fewer primary electrons getting absorbed by the target causes a lesser amount of charging and allows for focusing the beam to a smaller diameter in the sample plane.

In particular small apertures of multi aperture units require frequent cleaning due to high intensity radiation of their edges. Furthermore, frequent cleaning is necessary because of the large influence a contamination spot of given size has with respect to the total surface of a small apertures. For cleaning, the part of the electron beam column containing the multi aperture unit needs to be opened and its vacuum broken. After cleaning, time consuming realignment and adjustment steps are necessary before the electron beam device is fully operational again. Since this procedure results in considerable machine down-time, it is desirable to increase the interval at which such apertures need to be cleaned.

In the past, a variety of attempts have been made to reduce contamination of apertures e.g. use of hydrocarbon free vacuum and appropriate prior cleaning of vacuum chamber and aperture unit. In another attempt, apertures were heated during machine running time. The increased Brownian movement of the molecules at the edges of the apertures prevents the formation of contamination layers thereon. Yet, the installation of heaters in the vicinity of apertures is burdensome and costly.

SUMMARY OF THE INVENTION

The present invention intends to provide an improved charged beam column for examining a specimen with a charged particle beam. According to one aspect of the present invention, there is provided an apparatus as specified in claim 1.

According to a further aspect, the present invention also provides a method as specified in claim 11.

Further advantageous features, aspects and details of the invention are evident from the dependent claims, the description and the accompanying drawings. The claims are intended to be understood as a first non-limiting approach to define the invention in general terms.

According to preferred aspect there is provided a charged particle beam column with a first vacuum chamber. The charged particle beam device further comprises a particle source for providing a beam of charged particles and a multi aperture unit with at least two beam defining apertures for shaping the beam of charged particles. The particle source and the beam defining apertures are located within the first vacuum chamber. A separation unit for isolating a second vacuum chamber from the first vacuum chamber whereby the separation unit comprises a path aperture for the charged particle beam is arranged between the first and second vacuum chamber. A first deflecting unit directs the beam of charged particles through one of the beam defining apertures and a second deflecting unit directs the beam of charged particles through the path aperture.

According to a preferred aspect of the present invention, the first and or second deflecting unit is located outside the first vacuum chamber. This allows the use of smaller vacuum chambers and disposes of the need to provide sealing members for cables and connectors used to operate the deflecting units.

In a further preferred aspect of the present invention, the second deflecting unit guiding the beam of charged particles through the path aperture comprises two stages. The first one guides the beam coming through a selected beam defining aperture back to the optical axis. Then, the second stage guides it along the optical axis or, alternatively, in close vicinity to the optical axis. Advantageously, this allows the beam to be directed onto a trajectory close to the optical axis even before it passes through the path aperture of the separation unit. The second deflection unit already guides the beam to a direction so that it propagates towards the target or specimen without having to be directed again by a third deflecting unit.

According to a still further aspect of the present invention, there is provided a third deflection unit for directing the beam of charged particles through the objective lens after it has passed through the path aperture of the separation unit. In some preferred embodiments, the trajectory of the beam is tilted with respect to the optical axis after it has passed the first and second deflection unit. The third deflection unit, advantageously, compensates excessive tilt angles and redirects the charged particle beam so that the angle between the optical axis and the beam is reduced. Preferably, the third deflection unit is located in between the separation unit and the specimen.

In a preferred embodiment according to the invention, the third deflection unit comprises two deflection stages. The first stage of the deflection unit redirects the beam towards the optical axis and, subsequently, the second stage guides the beam along the optical axis or in close vicinity thereto. This preferred embodiment not only allows for a reduction of the angle between optical axis and beam, but also allows to the beam to propagate along, or in close vicinity, to the optical axis. Furthermore, in case the optical axes defined by path aperture and objective lens are not coaxial, the second stage allows the beam to be redirected along the optical axis as defined by the objective lens.

In another preferred embodiment, the vacuum in the first vacuum chamber is higher than the vacuum in the second chamber. Advantageously, the multi aperture located in the first vacuum chamber is kept at a higher vacuum. Thus, the time span in which contaminants develop at the path aperture and start to negatively influence the trajectory of the charged particle beam is slowed down by specifically reducing the number of hydrocarbons in this area. At the same time it is not necessary to maintain the vacuum level of the first vacuum chamber in parts of the beam column where contaminants have lesser disturbing influence.

In still another preferred embodiment, the first vacuum chamber is kept at ultra high vacuum. At this vacuum level, the number of hydrocarbons in the vicinity of the path defining apertures are drastically reduced which increases machine running times.

The invention is also directed to methods by which the described apparatus operates. It includes method steps for carrying out every function of the apparatus. These method steps may be performed by way of hardware components, a computer programmed by appropriate software, by any combination of the two or in any other manner.

BRIEF DESCRIPTION OF THE DRAWINGS

Some of the above indicated and other more detailed aspects of the invention will be described in the following description and partially illustrated with reference to the figures. Therein:

FIG. 1 is a schematic vertical cross section of a beam column for a charged particle beam device comprising a first, a second and a third double stage deflection unit. The first and second deflection unit are arranged outside a first vacuum chamber.

FIG. 2 is a schematic vertical cross section of a second embodiment of a beam column for a charged particle beam device comprising a first, a second and a third double stage deflection unit. The first and second deflection unit are arranged within a first vacuum chamber.

DESCRIPTION OF THE PREFERRED EMBODIMENTS

Figure 3:
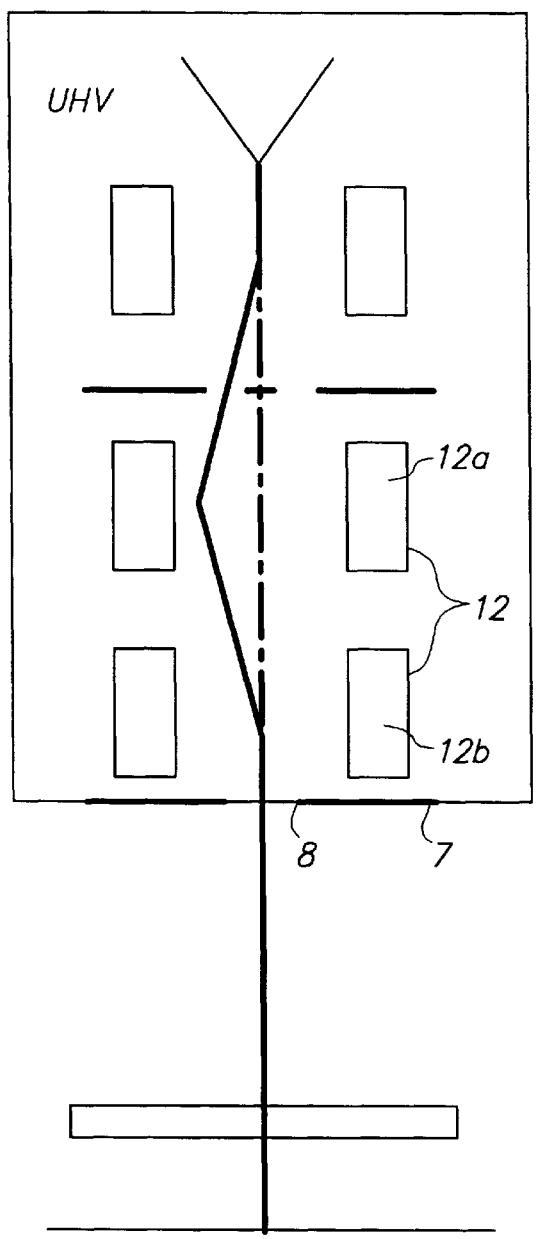
FIG. 3 is a schematic vertical cross section of a third embodiment of a beam column for a charged particle beam device comprising a first and a second double stage deflection unit. The first and second deflection unit are arranged within the first vacuum chamber.

An exemplary embodiment of an electron beam column used in an apparatus for examining specimen is shown in FIG. 1. Electron beam 4 comes from electron source 3 e.g. a Schottky emitter or a tungsten hairpin. An anode arranged below attracts and accelerates the electrons and a condenser lens concentrates them into a fine beam. The anode and the condenser lens are not shown in the drawings since they are not crucial for understanding the principles of the invention. A first deflection unit 11 deflects the e-beam path from optical axis 9 defined by electron source 3 and guides the e-beam through one of the beam defining openings 6 in multi aperture 5.

In the embodiment shown, multi aperture 5 is a circular flat disc having several beam defining openings 6 with a specified diameter. Before the e-beam passes through one of these openings, it generally has a diameter bigger than the diameter of the opening. Thus, the beam defining aperture only allows passage of electrons whose distance from the e-beam axis is smaller than the aperture diameter, and eliminates the rest. The first deflection unit is capable of directing e-beam 4 through any one of the beam defining apertures 6 in multi aperture unit 5 thereby determining the beam diameter and, consequently, the current of the e-beam. The selection of a specific beam defining aperture is the choice of the user and based on his intentions. In view of the present invention, it is not required to arrange beam defining apertures 6 in a specific pattern on multi aperture unit 5. It is, however, preferred to have sufficient distance between outer rims of adjacent apertures so that electrons flying on the outermost trajectories of the e-beam do not incidentally pass through neighboring apertures. On the other hand, the distances between outer rims of adjacent apertures should not be too wide. This permits deflections of the e-beam with smaller angles since the center of beam defining apertures 6 are arranged closer to the center of multi aperture unit 5. Furthermore, it is preferred to have one beam defining aperture located in the center of multi aperture unit 5. If a certain application requires the use of the center aperture, then it is not necessary to deflect the e-beam which can remain on the optical axis.

A second deflection unit 12 redirects the beam after its diameter has been defined by one of the apertures 6 and guides it through path aperture 8 of separation unit 7. The separation unit 7 is located between a first vacuum chamber 1 and a second vacuum chamber 2 and separates the two vacuums existing in each respective chamber. Thereby, the vacuum in the first chamber 1 is higher than the vacuum in the second chamber 2 or, in other words, the pressure in the second chamber is higher than the pressure in the first chamber. This reduces the number of hydrocarbon molecules in the surroundings of the beam defining apertures thus slowing down the formation of contaminants. In preferred embodiments, the vacuum in the first chamber 1 is at least five times as high as the vacuum in the second chamber. In even more preferred embodiments, the vacuum in the first chamber is at least 10 times as high as the vacuum in the second chamber. By establishing a pressure difference of about one order of magnitude, the number of hydrocarbon molecules present in the first chamber, compared with the number of hydrocarbon molecules present in the subsequent second chamber, is considerably reduced which results in even more enhanced running times of the charged particle-beam device.

Alternatively, it is preferred to establish in the first vacuum chamber 1 an ultra high vacuum of higher than $10^{-7}$ mbar. This reduces the number of all molecules including hydrocarbon molecules per $cm^{-3}$ to not more than $10^9$ and, consequently, slows down the formation of contamination spots. In even more preferred embodiments, an additional high vacuum of about $10^{-4}$ mbar to about $10^{-7}$ mbar is established in vacuum chamber 2. The additional existence of a high vacuum in the second vacuum chamber adjacent to the first vacuum chamber enhances machine running time even more. It is of course possible and advantageous to combine the aspects of establishing vacuum gradients as described in the preceding paragraph with the aspects of establishing an ultra high vacuum in the first vacuum chamber as described in the present paragraph.

Beam defining apertures 6 of multi aperture unit 5 are all arranged in vacuum chamber 1 which, preferably, also includes electron source 3. It is within the scope of the invention to place multi aperture plate 5 completely within vacuum chamber 1. In case the need arises to replace or clean plate 5, vacuum chamber 1 must be opened. If only the part of multi aperture plate 5 which contains beam defining apertures 6 is arranged within vacuum chamber 1 and the outer parts of the plate extend beyond it, then it is possible to insert the plate from the side without opening the whole chamber. Such an arrangement, however, requires ultra high vacuum seals between multi aperture plate 5 and the walls of vacuum chamber 1. Still, for replacement of the plate, it is necessary to break the vacuum.

Vacuum chamber 2 is located adjacent to vacuum chamber 1. Path aperture 8 of separation unit 7 provides a constant fluid communication between the two chambers and gases are exchanged. The difference in vacuum is maintained by vacuum pumps (not shown in FIG. 1) which are connected to each chamber. The vacuum pump connected to chamber 1 needs to evacuate gas at a rate which compensates the gas flow streaming from chamber 2 into chamber 1.

The vacuums in the beam column reduce interactions between gas molecules and electrons thus allowing the e-beam to travel along predictable paths. Nevertheless, due to the partial pressure of hydrocarbons and silicon oils from vacuum pumps and the grease of vacuum seals and fingerprints, hydrocarbon molecules are always present in the vacuum chambers. Radiation of same results in formation of polymerized contaminations. This happens, in particular, at the edges of beam defining apertures 6 which are exposed to higher e-beam radiation. By having these beam defining apertures located within a separate vacuum it is possible to considerably reduce the formation of contaminants. The diameter of path aperture 8 of separation unit 7 is preferably higher than the diameter of each one of the beam defining apertures. Hence, after the e-beam diameter has been delimited by one of apertures 6, the electron radiation intensity at the edges of path aperture 8 is lower than the one at the edges of beam defining apertures 6. Since the slimmed down beam contains less electrons which are all confined to an area smaller than one of the path aperture, they do not hit the edge of the aperture itself. Advantageously, this compensates for the higher concentration of carbon molecules in the vicinity of path aperture 8.

Separation unit 7 can be formed out of a circular flat disc with path aperture 8 in its center. The flat disc is then arranged between vacuum chambers 1 and 2 whereby vacuum seals are interposed at the contact areas of the respective chamber walls and the flat disc. This allows separation unit 7 to be replaced if necessary. Alternatively, it is possible to provide a wall separating vacuum chamber 1 and 2. with a path opening. In such an arrangement it is not necessary to use vacuum seals. The path aperture is used to isolate the two vacuum chambers.

FIG. 1 shows the first and second deflection unit located outside vacuum chamber 1. The smaller vacuum chambers are easier to evacuate and to maintain at a high vacuum level. Also, cables and wires necessary for operating the deflection units don't need to be put through the vacuum chamber walls and the respective cable and wire passages don't need to be equipped with vacuum seals. A further advantage is that the inner layout of vacuum chamber 1 does not need to include holding and alignment means for the deflection units.

The deflection of a charged particle beam is achieved by applying transverse electrostatic and magnetic fields. Charged particles move around parabolic trajectories in a uniform electrostatic field E of a parallel plate capacitor and, around a circle in a uniform magnetic field B. Thus, in principle, all kinds of electric and magnetic field producing equipment can be used for deflection units. In the embodiment shown in FIG. 1, with the deflection units being located outside the vacuum chamber, attention has to be paid to the influence the materials used for the chamber wall will have on the deflection fields. Preferably, non magnetic materials are used together with deflection units operating with magnetic fields and non conductive materials are used together with deflection units operating with electric fields.

After the e-beam passes through path aperture 8 it enters vacuum chamber 2. It is, for the present invention, not important which part of the electron optic or the beam column is arranged within vacuum chamber 2. Furthermore, it is not important if the e-beam on its way from vacuum chamber 1 to its target passes through additional vacuum chambers. Therefore, parts of the following explanations: concentrate on the description of arrangements of further deflection units for guiding the e-beam to its target without further discussing specific locations of these deflection units.

In general, it is desirable to let the e-beam intersect the optical axis at a small angle. A third deflection unit 13 located below separation unit 7 preferably redirects e-beam 4 passing through path aperture 8 and guides it through objective lens 10. In FIG. 1 the optical axis defined by objective lens 10 is not coaxial with the axis defined by path aperture 8. In order to avoid imaging artifacts, it is important to let the e-beam pass through the objective lens close to its optical axis. Depending on the lateral displacement between the two axes, it is sometimes possible to guide e-beam 4 in a single deflection step through objective lens 10. In such case, e-beam 4 passes through the objective lens with a slight tilt in respect to the optical axis of the objective lens. To avoid the tilt, it is preferred to use a double deflection step. In a first step, the e-beam is deflected so that it intersects the optical axis of objective lens 10 and, subsequently, in a second step the e-beam is deflected again so that it propagates directly along the optical axis of the objective lens. It is also possible to redirect the e-beam in the second step so that it does not propagate directly on the optical axis of objective lens 10 but more or less parallel to and in direct vicinity of same.

FIG. 2 shows a further embodiment according to the invention. Different to the above described beam column, the first and second deflection unit are now located within first vacuum chamber 1. The smaller distance between deflection units and e-beam to be deflected allows the use of deflection units operating with weaker electromagnetic fields. Furthermore, a much larger variety of materials may be used for producing the walls of vacuum chamber 1 since their influence on the deflection fields are considerably smaller.

An alternative arrangement of deflection units is shown in FIG. 3. Here, second deflection unit 12 comprises two deflection stages 12a and 12b. This embodiment is preferably used in beam columns in which the optical axis defined by path aperture 8 and the optical axis defined by objective lens 10 are coaxial. The e-beam, after having been delimited by beam defining aperture 6, diverges from optical axis 9. In a first step, deflection unit 12a redirects e-beam and guides it back towards the optical axis. At the point of intersection or, in case the e-beam does not intersect with optical axis 9, at a point where the e-beam passes optical axis 9 in close vicinity, deflection unit 12b redirects e-beam 4 so that it propagates along optical axis 9 or in close vicinity to optical axis 9 and more or less parallel to it. The expression "more or less parallel" within the meaning of this invention includes deviations in which the e-beam still passes the objective lens close to its center without causing excessive imaging artifacts.

The provision of a double stage second deflection unit 12a and 12b disposes, in certain applications, with the provision of a third deflection stage 13, since e-beam 4 already propagates in a direction close to the optical axis. Nevertheless, even in a beam column with a double stage second deflection unit 12a and 12b, it is in some applications preferred to have an additional double stage third deflection unit 13a and 13b. The provision of such allows, after the beam has passed path aperture 8, conducting a parallel shift of the e-beam.

Figure 4:
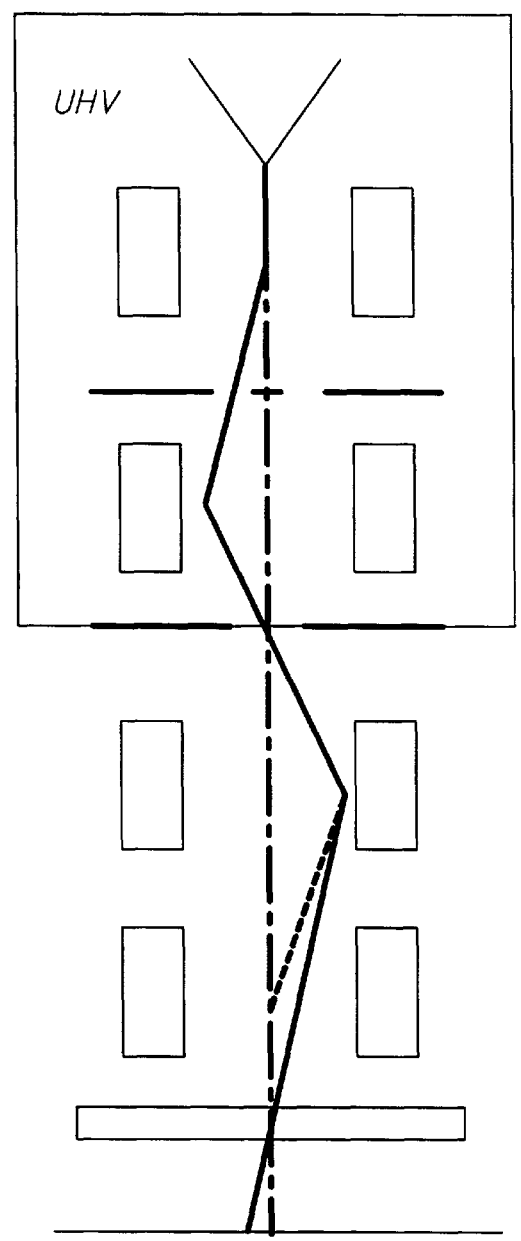
FIG. 4 is a schematic vertical cross section of a fourth embodiment of a beam column for a charged particle beam device comprising a first, a second and a third double stage deflection unit. The first and second deflection unit are arranged within the first vacuum chamber.

FIG. 4 shows a still further embodiment according to the invention. Here, a single stage second deflection unit 12 is combined with a double stage third deflection unit 13. Such an arrangement is advantageously used in beam columns in which the optical axes defined by path aperture 8 and objective lens 10 are coaxial. Compared with the arrangement shown in FIG. 3, an additional deflection stage has to be used. On the other hand, the part of the beam column between separation unit 7 and objective lens 10 is in many devices more spacious than the upper part of the beam column and allows more options in installing the third deflection units. It is within the scope of the present invention to arrange the first and second deflection units, as shown in FIGS. 3 and 4, outside vacuum chamber 1 as well.

Figure 5:
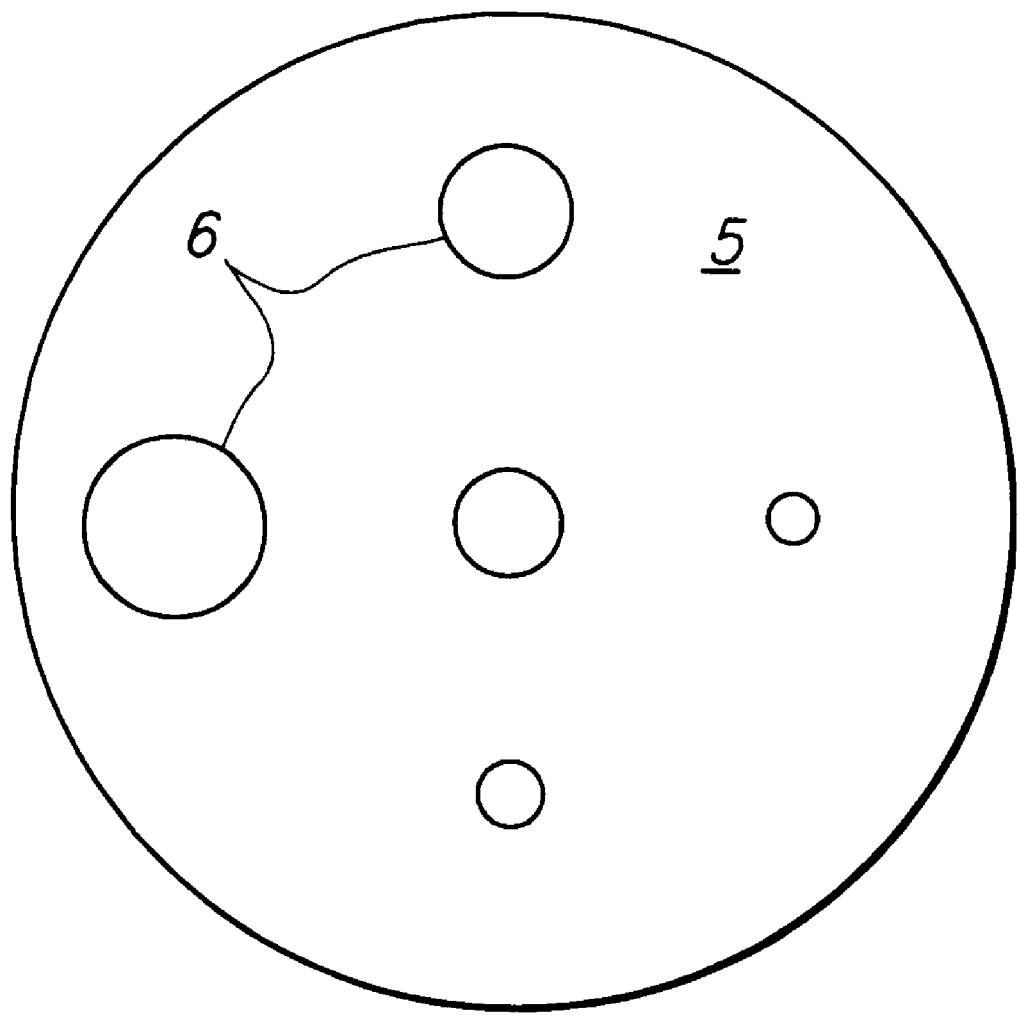
FIG. 5 shows a top view of a multi aperture unit with several beam defining apertures arranged in a circle around the center beam defining aperture located in the middle of the circular plate.

FIG. 5 shows a top view of a multi aperture unit with several beam defining apertures arranged in a circle around a center beam defining aperture which is located in the middle of the circular plate. It is possible to use a multi aperture blade with a larger diameter without changing the arrangement of beam defining apertures 6 in respect to each other and without changing their dimensions. This increases the outer rim of multi aperture plate 5 and adapts it to various sizes of vacuum chambers. With a distance of about 5 cm between charged particle source and multi aperture plate and aperture sizes between 5 $\mu$m and 50 $\mu$m the beam current can be varied by a factor of 100.

Figure 6:
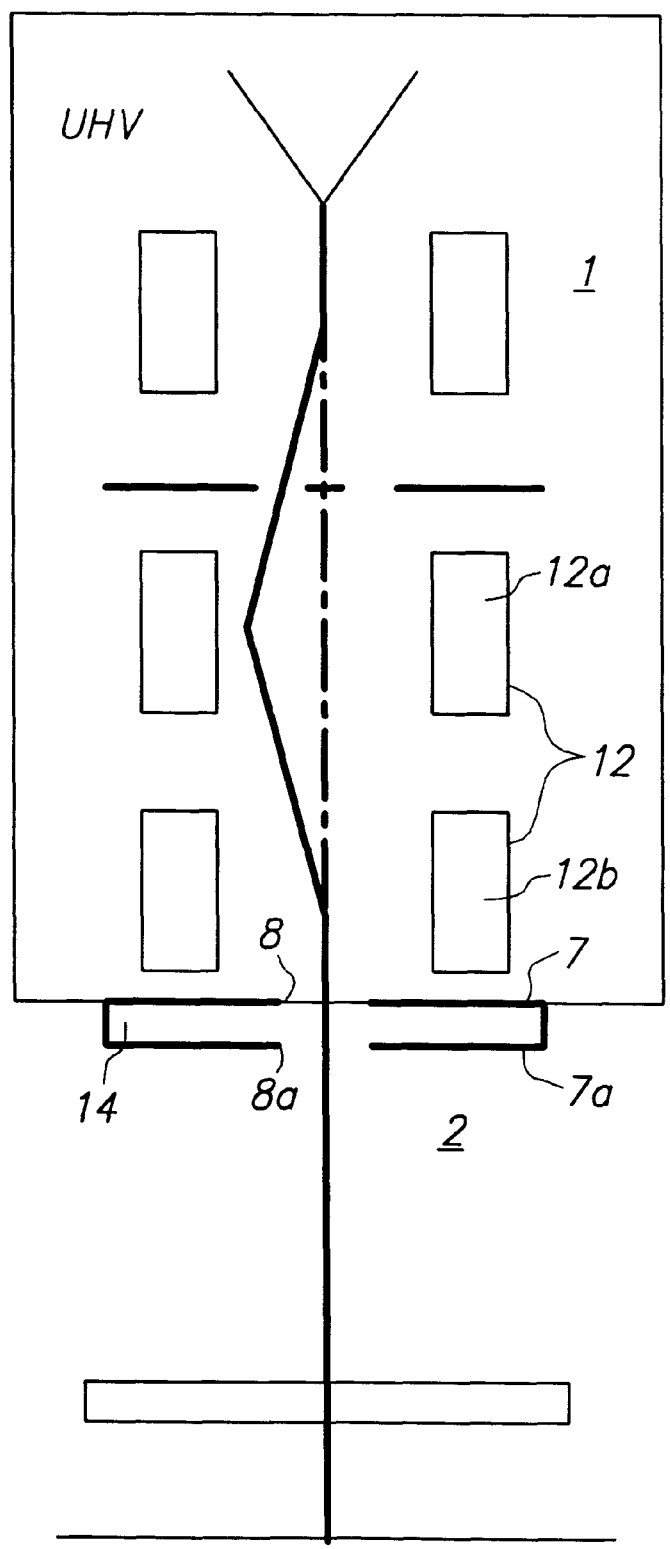
FIG. 6 shows a schematic vertical cross section of a fifth embodiment of a beam column for a charged particle beam device comparing a first and a second double stage deflection unit. The first and second deflection units are arranged within the first vacuum chamber.

FIG. 6 shows the embodiment of FIG. 3 including one modification. Separation unit 7 comprises a further separation means 7a which is also provided with a path aperture 8a. The space created between the two plates can function as independent vacuum chamber 14 connected to a separate vacuum pump (not shown). The installment of an additional vacuum chamber 14 allows better isolation between the first and second vacuum chamber 5. Gas molecules moving from the higher pressure second vacuum chamber 2 through path aperture 8a in the direction of lower pressure vacuum chamber 1 get trapped in isolation vacuum chamber 14. Caught in this chamber, these molecules can be evacuated before they enter the first vacuum chamber. Hence, it is easier to maintain a desired vacuum gradient between the first and second vacuum chamber. The double path aperture described above can be used in all other embodiments according to the present invention, in particular in those shown in FIGS. 1, 2 and 4.

The double path aperture, compared with a single path aperture, still provides better isloation even so it is not connected to a vacuum pump. In this case the space between the two plates does not function as a vacuum chamber, however, gas particles still need to pass both apertures before they can contribute to the pressure in the adjacent chamber. This preferred embodiment does not require an additional vacuum chamber.

What is claimed is:

1. A charged particle beam column comprising:
   a first vacuum chamber (1);
   a particle source (3) for providing a beam of charged particles (4) propagating along an optical axis (9);
   a multi aperture unit (5) comprising at least two beam defining apertures (6) for shaping the beam of charged particles, the particle source and the beam defining apertures being located within the first vacuum chamber;
   a separation unit (7) for isolating a second vacuum chamber (2) from the first vacuum chamber whereby the separation unit comprises a path aperture (8) for the charged particle beam;
   a first deflecting unit (11) for directing the beam of charged particles through one of the beam defining apertures (6); and
   a second deflecting unit (12) for directing the beam of charged particles through the path aperture (8).

2. The charged particle beam column according to claim 1 whereby the diameter of the path aperture (8) is larger than the largest diameter of the beam defining apertures (6).

3. The charged particle beam column according to claim 1 whereby the first vacuum chamber is an ultra high vacuum chamber.

4. The charged particle beam column according to claim 1 whereby the second vacuum chamber is a high vacuum chamber.

5. The charged particle beam column according to claim 1 wherein the first and/or the second deflecting unit (11, 12) is located outside the first vacuum chamber.

6. The charged particle beam column according to claim 5 whereby the second deflecting unit (12) comprises two deflecting stages, a first stage (12a) for directing the beam of charged particles towards the optical axis (9) and a second stage (12b) for directing the beam of charged particles onto or in close vicinity to the optical axis (9).

7. The charged particle beam column according to claim 5 further comprising a third deflecting unit (13) for directing the beam of charged particles through an objective lens (10).

8. The charged particle beam column according to claim 5 whereby the diameter of the path aperture (8) is larger than the largest diameter of the beam defining apertures (6).

9. The charged particle beam column according to claim 5 whereby the vacuum established in the first chamber 1 is higher than the vacuum established in the second chamber 2.

10. The charged particle beam column according to claim 5 whereby the first vacuum chamber is an ultra high vacuum chamber.

11. The charged particle beam column according to claim 1 whereby the second deflecting unit (12) comprises two deflecting stages, a first stage (12a) for directing the beam of charged particles towards the optical axis (9) and a second stage (12b) for directing the beam of charged particles onto or in close vicinity to the optical axis (9).

12. The charged particle beam column according to claim 11 further comprising a third deflecting unit (13) for directing the beam of charged particles through an objective lens (10).

13. The charged particle beam column according to claim 1 further comprising a third deflecting unit (13) for directing the beam of charged particles through an objective lens (10).

14. The charged particle beam column according to claim 13 whereby the third deflecting unit (13) comprises two deflecting stages, a first stage (13a) for directing the beam of charged particles towards the optical axis (9) and a second stage (13b) for directing the beam of charged particles onto or in close vicinity to the optical axis (9).

15. The charged particle beam column according to claim 13 whereby the third deflecting unit (13) is located downstream of the separation unit (7).

16. The charged particle beam column according to claim 15 whereby the third deflecting unit (13) comprises two deflecting stages, a first stage (13a) for directing the beam of charged particles towards the optical axis (9) and a second stage (13b) for directing the beam of charged particles onto or in close vicinity to the optical axis (9).

17. The charged particle beam column according to claim 1 whereby the vacuum established in the first chamber 1 is higher than the vacuum established in the second chamber 2.

18. The charged particle beam column according to claim 17 whereby the vacuum established in the first vacuum chamber 1 is five times higher than the vacuum in the second vacuum chamber 2.

19. The charged particle beam column according to claim 17 whereby the vacuum established in the first vacuum chamber 1 is ten times higher than the vacuum in the second vacuum chamber 2.

20. A method of guiding a charged particle beam through a charged particle beam column comprising the following steps:

a. using a first deflection unit to guide a charged particle beam through a beam defining aperture of a multi aperture unit located in a first vacuum chamber;

b. using a second defelection unit to guide the charged particle beam through a path aperture of a separation unit isolating the first vacuum chamber from a second vacuum chamber.

\* \* \* \* \*